United States Patent [19]

Snodgrass

[11] Patent Number: 4,574,248
[45] Date of Patent: Mar. 4, 1986

[54] RF POWER AMPLIFIER FOR USE WITH VHF TRANSCEIVERS

[75] Inventor: Kirk A. Snodgrass, Phoenix, Ariz.

[73] Assignee: Rockwell International Corporation, El Segundo, Calif.

[21] Appl. No.: 607,849

[22] Filed: May 7, 1984

[51] Int. Cl.⁴ .................... H03G 3/20; G01R 21/00
[52] U.S. Cl. ........................... 330/2; 330/134; 330/135; 330/136; 330/279; 455/115; 455/246
[58] Field of Search .................. 330/2, 134, 135, 136, 330/207 P, 279, 277, 298, 138, 280; 455/126, 115, 117, 234, 246, 250, 242; 332/18, 37 R, 37 D

[56] References Cited

U.S. PATENT DOCUMENTS

| | | | |
|---|---|---|---|
| 3,486,128 | 12/1969 | Lohrmann | 332/37 R X |
| 3,900,823 | 8/1975 | Sokal et al. | 455/126 X |
| 4,476,437 | 10/1984 | Fujiwara | 330/279 X |

FOREIGN PATENT DOCUMENTS

| | | | |
|---|---|---|---|
| 10648 | 1/1979 | Japan | 330/2 |
| 3469 | 3/1980 | Japan | 332/37 D |
| 634450 | 11/1978 | U.S.S.R. | 330/134 X |

*Primary Examiner*—James B. Mullins
*Attorney, Agent, or Firm*—George A. Montanye; H. Fredrick Hamann

[57] ABSTRACT

An improved power amplifier is disclosed which is particularly useful with very high frequency (VHF) transceivers. The power amplifier includes a control loop configured to sense the input radio frequency signal and use that signal as a reference for comparison with the radio frequency output from the amplifier to control amplifier power output. The loop forces the amplifier's output radio frequency envelope to follow the input radio frequency envelope and thus produce a constant gain loop. A limiter in the loop forces the loop to produce a constant power output when the input signal exceeds a level set by the limiter.

11 Claims, 2 Drawing Figures

RF POWER AMPLIFIER FOR USE WITH VHF TRANSCEIVERS

BACKGROUND OF THE INVENTION

The present invention relates to amplifiers and, more particularly, to power amplifiers for use with radio frequency transceivers.

In prior art communication systems, transceivers are generally constructed to have transmitters with radio frequency outputs of limited power. In particular, in many very high frequency (VHF, 30-88 MHz) communication transceivers, the transmitters have a limited power output in the range of 5-10 watts. As will be appreciated, such fixer power output limits the versatility of the transceiver in different operational environments where greater output may be required.

Although it is apparent that the output of such transceivers can be boosted by use of power amplifiers, the actual implementation to achieve such amplification is not straightforward. In particular, different makes and types of communication transceivers have varying requirements which restrict their use without special modification. Specifically, the interface and control circuitry necessary for cooperation of a particular amplifier with an identified transceiver may be complex in construction and thereafter limited to only one type of transceiver. As a result, multiple amplifier designs and modifications would be required in order to address all types of communication transceivers for which increased power output is desired.

By way of example, numerous communication systems currently employ a frequency hopping capability to allow its reliable use in an interference environment. As a result, the construction of the transceiver to accomplish that frequency hopping is inherently more complex in operation and control. In order to provide an amplifier capable of being compatible with such frequency hopping capabilty, the same must meet the hopping requirements and interface with the required controls and interface structures of the particular transceivers. Due to the variety of frequency hopping designs, power amplifiers for such systems are normally specifically tailored to the particular communication system. There is therefore a continuing need for amplifier designs and construction which allow amplifier use with a variety of communication transceivers to thereby extend the versatility of the amplifiers and transceivers.

Accordingly, the present invention has been developed to overcome the specific shortcomings of the above known and similar techniques, and to provide a radio frequency power amplifier system which is compatible with different communication systems.

SUMMARY OF THE INVENTION

In accordance with the present invention, the radio frequency signal output from a transceiver is coupled as the input to a power amplifier through a directional coupler to provide a sample of the RF input. The sampled input is coupled through a radio frequency detector to detect the envelope of the RF input and thence through a limiter to the input of a difference amplifier. The output from the power amplifier is coupled through a lowpass filter to provide the amplified radio frequency output through a second directional coupler to provide a sample of that radio frequency output. The sampled output is also coupled through an RF detector to detect the envelope of the RF output and provide that of the second input to a difference amplifier. The output of the difference amplifier is then used to control the bias of the RF power amplifier for power output control. The signal representing the detected envelope of the RF input and the RF output are also compared in a difference amplifier to produce an output which is compared with a fault threshold to provide a fault signal representing a failure in the output of the control loop or power amplifier.

It is therefore a feature of the invention to provide an improved power amplifier system.

It is still another feature of the invention to provide a power amplifier system which may be used with a variety of communication transceivers.

Still another feature of the invention is to provide a power amplifier system having a control loop using the input radio frequency signal envelope as a reference.

Yet another feature of the invention is to provide a power amplifier system which may be employed in connection with frequency hopping transceivers with minor modification for a variety of transceiver types.

Still a further feature of the invention is to provide a power amplifier system of less complex construction for use with a variety of communication transceivers.

A still further feature of the invention is to provide a more versatile power amplifier system for use with VHF transceivers and which has improved fault isolation.

These and other advantages and novel features of the invention will become apparent when considered with the accompanying drawings wherein:

DETAILED DESCRIPTION OF A PREFERRED EMBODIMENT

Figure 1:
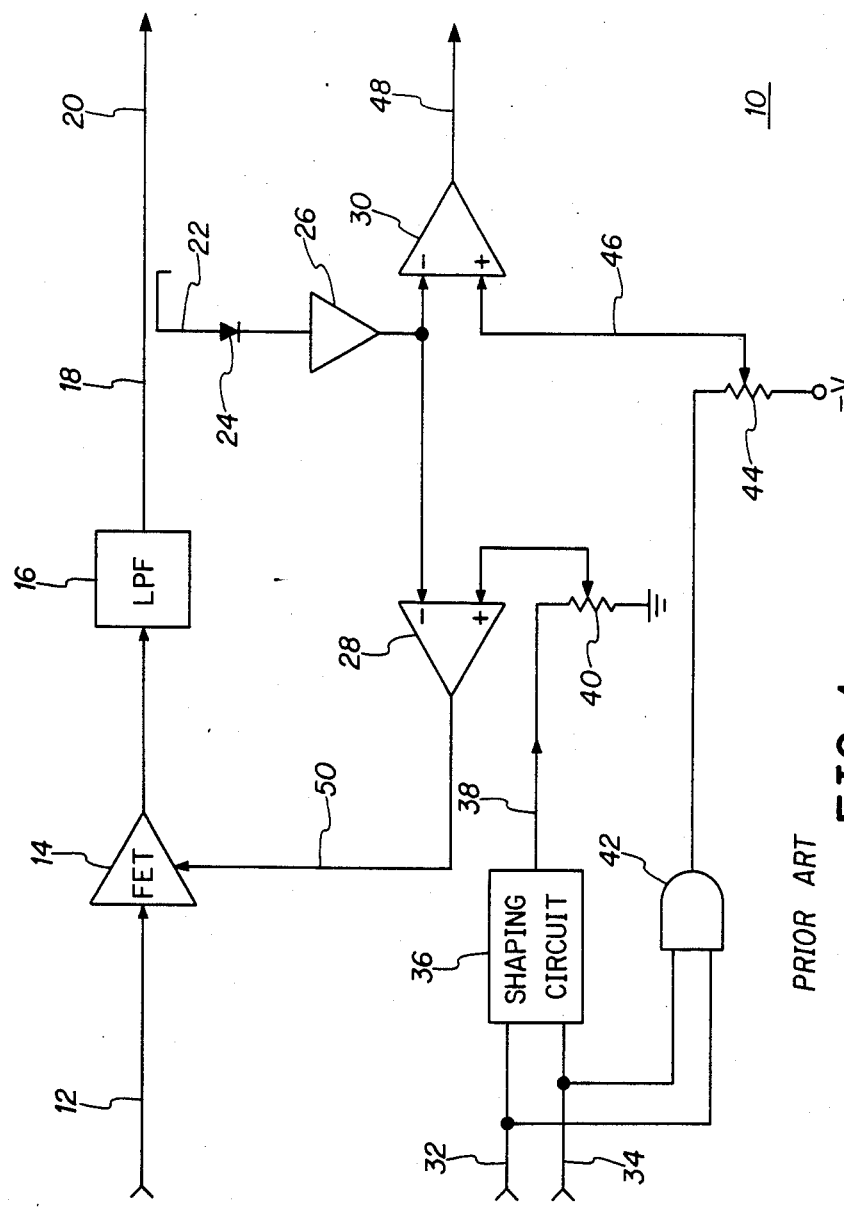
FIG. 1 is a schematic diagram of a power amplifier circuit of the prior art.

Referring now to FIG. 1, wherein like numerals are used to show like elements throughout, there is shown a typical VHF power amplifier system known in the prior art. Such amplifiers may be used in connection with VHF transceivers where it is desirable to increase the power output of signal transmission for operation in different environments. In the present example, the amplifier system will be described in connection with the use of the power amplifier to amplify a 5 watt VHF transceiver output to a 50 watt output, although it will be apparent that the same is applicable to other transceivers of different configurations and design having different power output requirements.

In the circuit shown in FIG. 1, a conventional transceiver radio frequency output is provided as the radio frequency (RF) input to terminal 12 of the power amplifier system 10. This RF input is coupled through a conventional RF power amplifier 14 which may be constructed as a conventional FET power amplifier. The output of the power amplifier 14 is coupled through a lowpass filter 16 and thence through a directional coupler 18 to provide the amplifier RF output at terminal 20. The directional coupler is used to provide a sample of the RF output over line 22 and through a diode 24 schematically representing an RF detector. The detected RF from the diode 24 is coupled through a conventional buffer amplifier 26 to provide an input to the negative (inverting input) terminal of a difference amplifier 28 and a comparator 30.

A signal representing the transmit and blanking pulses produced by the transceiver are provided to input terminals 32 and 34, respectively. These pulses are coupled through a conventional shaping circuit 36 to provide a shaped input reference signal on line 38 which is coupled through a potentiometer 40, or similar power adjustment circuit, as the positive (non-inverting) input to differential amplifier 28. The same two pulse inputs to terminals 32 and 34 are coupled as inputs to AND-gate 42 which has its output coupled through a potentiometer 44 having one terminal coupled to a voltage reference source. The output 46 from the potentiometer then provides a fault threshold signal which is provided as the positive input to comparator 30. The output 48 of comparator 30 then provides a signal which represents a fault in the amplifier system 10 while the output 50 of the difference amplifier 28 is coupled to control the gate bias of the FETs forming the power amplifier 14.

As will be understood by one familiar with the construction and operation of such prior art amplifier systems as detailed in FIG. 1, the RF amplifier output power at 20 is leveled by the feedback loop which developes a control signal over line 50 by comparison, (in differential amplifier 28) of the RF output envelope with the shaped input reference signal provided over line 38. As a result, the RF output envelope is controlled in response to the shaped input reference signal, thereby requiring the presence of the RF input signal. In particular, the shaping is needed in a frequency hopping system to control the spectral width of the output signals.

In such systems, two digital signals from the transceiver are typically used to generate the shaped reference in the shaping circuit 36. Those same two signals are also used to create the fault circuit timing and reference pulse through AND-gate 42 which prevents the output power monitor represented by comparator 30 from falsely indicating a fault when the transmitter is not keyed. Because there are numerous ways to generate this shaped reference and fault timing signals, the power amplifier and control system 10 must be custom designed to interface with the controls and interface of a specific receiver. As a result, such VHF amplifiers as are shown in FIG. 1 are not generally applicable to a wide range of transceivers.

In addition to the above, the fault monitor at the output of comparator 30 is not entirely accurate. In the system of FIG. 1, a low power output due to insufficient input power at terminal 12 will mistakenly indicate an amplifier fault when, in fact, the same is a transceiver fault. Furthermore, it will be clear that the system is not linear and can only be used with FM transceivers.

Figure 2:
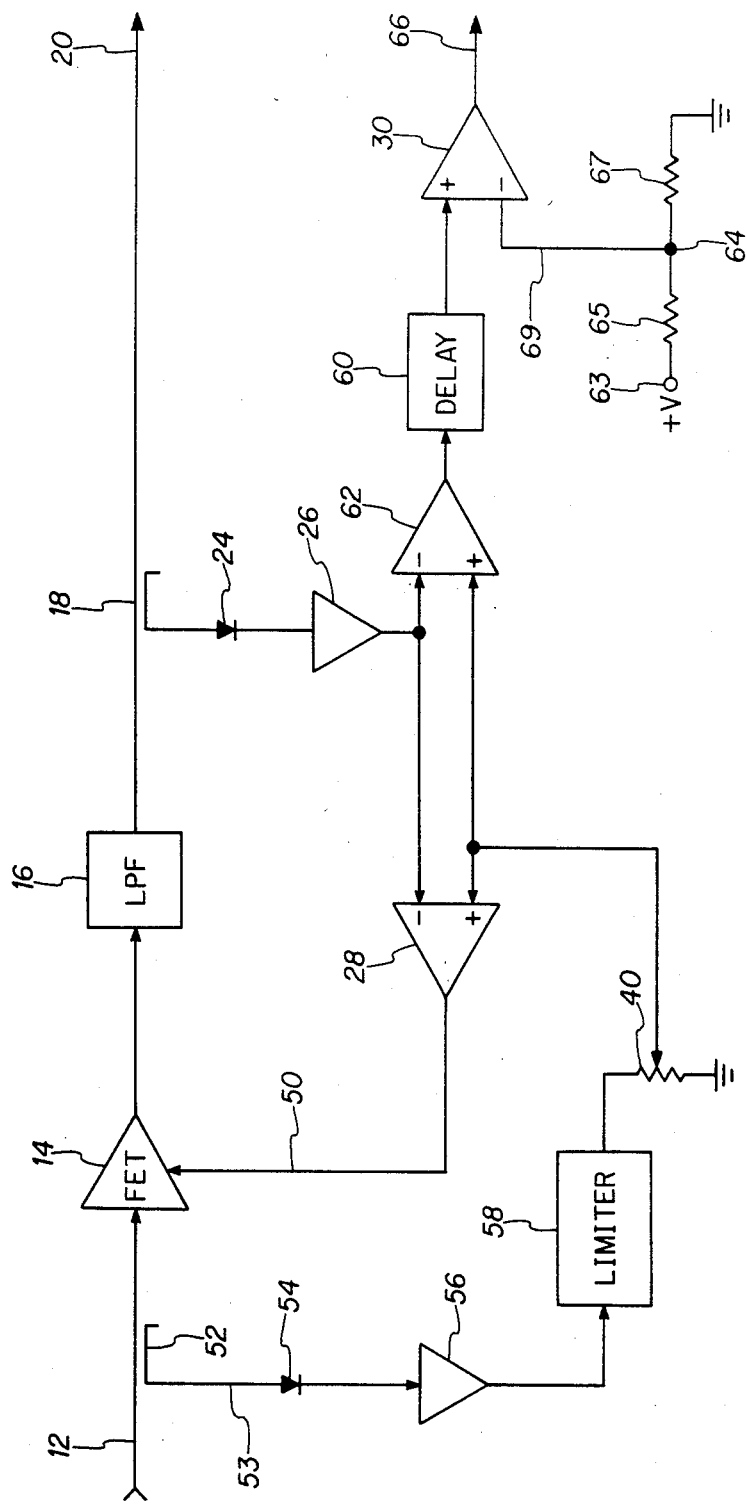
FIG. 2 is a schematic diagram showing the power amplifier and control system of the present invention.

Referring now to FIG. 2, there is shown an improved VHF power amplifier system for providing power amplification of a transceiver output. Similar to the construction of the circuit of FIG. 1, the RF input from a transceiver is coupled through terminal 12 to a power amplifier 14. However, the input from terminal 12 is coupled through a directional coupler 52 to provide a sample of the RF input signal on line 53. The output of the power amplifier 14 is then coupled in a conventional manner through lowpass filter 16 and directional coupler 18 to provide the amplified RF output at terminal 20. Likewise, the sample of the RF output is coupled through RF detector 24 and buffer amplifier 26 to provide a representation of the envelope of the amplified RF output to the negative input of differential amplifier 28 and differential amplifier 62.

The sampled RF input signal on line 53 is coupled through RF detector 54 represented as a diode to provide a signal representative of the envelope of the RF input through buffer amplifier 56 to limiter 58. The output from the limiter 58 is provided through a gain adjust circuit 40, which may be implemented as a conventional potentiometer and thence as the positive input to the differential amplifiers 28 and 62. As was noted with respect to the circuit of FIG. 1, the output from differential amplifier 28 is then provided as the control signal on line 50 for controlling the gate bias of the FETs forming the power amplifier 14.

The output from the differential amplifier 62 is coupled through a delay 60 and thence to the positive (non-inverting) input of the comparator 30. A fault threshold circuit 64 formed by a voltage source 63 coupled through resistors 65 and 67 to ground is used to produce a threshold voltage on line 69 which is provided as the negative (inverting) input to the comparator 30. The output 66 from the comparator 30 then forms the signal representing a fault in the amplifier.

Referring still to FIG. 2, the operation will now be apparent from the interconnection defined. Specificlly, the input RF signal is detected by the envelope detector 54 which provides an input RF envelope as the signal reference through the limiter 58. Shaping is not required because the output signal of the transceiver is already shaped. By coupling the output of the limiter through the potentiometer 40 to the negative input of the differential amplifier 28, the output RF envelope of the amplifier is forced by the loop control signal 50 to follow the input RF envelope. As will be appreciated, this produces a constant gain loop operation.

In accordance with the above, when the input signal is larger than the level set by the limiter, the constant gain loop becomes a constant power output loop. Thus, the only constraint on the RF input signal at terminal 12 is that it must be limited so that it does not damage the FETs in the amplifier 14. Using RF power amplifiers of conventional construction, it has been found that the amplifier can tolerate over 20 watts of input power at the terminal 12. Thus, the amplifier can be used with a wide variety of transceivers having different power outputs in order to boost their power for use in different environments. Because of the simplicity of the construction, there is no need to provide a variety of control and interface techniques or structures. The only control that is required betwen the system of FIG. 2 and the transceiver is the customary control line which switches the transmit and receive relays to control the time periods of transmission and reception.

In addition to the above, the circuit of FIG. 2 provides an improved isolation for fault detection. In particular, the circuit shown in FIG. 2 produces a fault indication at the output 66 in response to gain faults, rather than output power. Specifically, if there is a loss in the loop formed by a loop failure or amplifier failure, there will be provided a fault indication. However, if there is only low power output due to low input power from the tranceiver, there will be no fault indication.

In addition to the above, it should be appreciated that the circuit of FIG. 2 can be used in connection with AM (amplitude modulated) transmissions as opposed to the conventional FM (frequency modulated) transmissions. In particular, because the system is operating as a constant gain loop, it is linear with respect to the input RF signal. Accordingly, for peak RF inputs below the limiter threshold, the amplifier will allow operation with AM. Naturally, when the peak values exceed the limiter, the same will preclude the transmission of AM but is compatible with constant power output transmission of FM.

In the operation of the above circuit, it has been found that the loop can be constructed to converge in less than 3 microseconds, which is much faster than the RF pulse rise time required for most frequency hopping transceivers. Accordingly, the power amplifier system may be applied to the new generation transceivers having the frequency hopping construction. This can all be accomplished without the necessity for complex modifications to the power amplifier to accommodate transceiver and control interface requirements for different types of frequency hopping transceivers. As a result, the power amplifier system will have improved versatility for operations in a variety of environments with different transceivers.

Obviously many other modifications and variations of the present invention are possible in light of the above teachings. It is therefore to be understood that within the scope of the appended claims, the invention may be practiced otherwise than as specifically described.

What is claimed is:

1. A power amplifier system comprising:
   means for providing an input signal;
   means for amplifying said input signal and providing an amplified output signal; and
   means for comparing a sample of said input signal forming a reference signal with a sample of said output signal for controlling the amplification produced by said means for amplifying to produce a constant gain for input signal levels less than or equal to a predetermined limit and a constant power output for signal levels exceeding said predetermined limit.

2. The system of claim 1 wherein said means for amplifying is an amplifier having an adjustable gain and said means for comparing comprises:
   first means for sampling said input signal;
   means for detecting the envelope of said input signal;
   means for limiting said detected envelope to provide an output signal;
   a difference amplifier having a positive input terminal coupled to the limited output signal, a negative input terminal and an output coupled to adjust amplifier gain;
   second means for sampling said amplified output signal;
   means for detecting the envelope of said sampled amplified output signal and providing that signal as the input to the negative terminal of said differential amplifier.

3. The system of claim 2 wherein said amplifier is an FET power amplifier.

4. The system of claim 3 further including means for lowpass filtering the output of said power amplifier.

5. The system of claim 3 further including means for providing a fault indication in response to power amplifier failure.

6. The system of claim 5 wherein said means for comparing forms a loop for controlling amplifier gain and said means for providing a fault indication includes means responsive to loop gain failure for providing a fault output indication.

7. In a transceiver having a power amplifier system for amplifying the output, the improvement in said power amplifier system comprising:
   means for providing an input signal;
   means for amplifying said input signal and providing an amplified output signal;
   means for comparing a sample of said input signal forming a reference signal with a sample of said output signal for controlling the amplification produced by said means for amplifying to produce a constant gain for input signal levels less than or equal to a predetermined limit and a constant power for input signal levels greater than said predetermined limit.

8. In a communication system having a transmitter for generating radio frequency energy and amplifying that radio frequency energy with a power amplifier system, the improvement in said power amplifier system comprising:
   means for providing an input signal;
   means for amplifying said input signal and providing an amplified output signal, said means for amplifying including an amplifier having an adjustable gain; and
   means for comparing a sample of said input signal forming a reference signal with a sample of said output signal for controlling the amplification produced by said means for amplifying, wherein said means for comparing includes:
   first means for sampling said input signal;
   means for detecting the envelope of said input signal;
   means for limiting said detected envelope to provide an output signal;
   a difference amplifier having a positive input terminal coupled to the limited output signal, a negative input terminal and an output coupled to adjust amplifier gain;
   second means for sampling said amplified output signal; and
   means for detecting the envelope of said sampled amplified output signal and providing that signal as the input to the negative terminal of said differential amplifier;
   said means for limiting producing a constant gain in the input signal for input signal levels less than or equal to a predetermined limit and a constant power for input signal levels exceeding said predetermined limit.

9. The system of claim 8 further comprising means responsive to gain for providing a fault indication.

10. A power amplifier system comprising:
    means for providing an input signal;
    means for amplifying said input signal and providing an amplified output signal, said means for amplifying comprising a FET power amplifier having an adjustable gain;
    means for comparing a sample of said input signal forming a reference signal with a sample of said output signal for controlling the amplification produced by said means amplifying, said means for comparing comprising
    first means for sampling said input signal,
    means for detecting the envelope of said input signal, means for limiting said detected envelope to provide an output signal, a difference amplifier having a positive input terminal coupled to the limited output signal, a negative input terminal, and an output coupled to adjust amplifier gain, second means for sampling said amplified output signal, and means for detecting the envelope of said sampled amplified output signal and providing that signal as the input to the negative terminal of said differential amplifier; and means for providing a fault indication in response to power amplifier failure, said means for providing a fault indication comprising, a differential amplifier having a negative terminal coupled to receive the detected envelope of said sampled amplified output signal, a positive input coupled to receive the limited output signal, and an output, means coupled to delay the output of said differential amplifier to provide a delayed output, a comparator having a positive terminal coupled to receive the delayed output, a negative terminal, and an output for providing a fault indication, and means for providing a voltage reference representing a fault threshold as an input signal to said negative terminal of the comparator.

11. In a communication system having a transmitter for generating radio frequency energy and amplifying that radio frequency energy with a power amplifier system, the improvement in said power amplifier system comprising:

means for providing an input signal;

means for amplifying said input signal and providing an amplified output signal, said means for amplifying including an amplifier having an adjustable gain;

means for comparing a sample of said input signal forming a reference signal with a sample of said output signal for controlling the amplification produced by said means for amplifying, wherein said means for comparing includes, first means for sampling said input signal, means for detecting the envelope of said input signal, means for limiting said detected envelope to provide an output signal, a difference amplifier having a positive input terminal coupled to the limited output signal, a negative input terminal and an output coupled to adjust amplifier gain, second means for sampling said amplified output signal, and means for detecting the envelope of said sampled amplified output signal and providing that signal as the input to the negative terminal of said differential amplifier; and means responsive to gain for providing a fault indication, said means for providing a fault indication comprising, a differential amplifier having a negative input terminal coupled to receive the detected envelope of said sample amplified output signal, a positive input coupled to receive the limited output signal, and an output, means coupled to delay the output of said differential amplifier to provide a delayed output, a comparator having a positive terminal coupled to receive the delayed output, a negative terminal, and an output for providing a fault indication, and means for providing a voltage reference representing a fault threshold as an input signal to said negative terminal of the comparator.

* * * * *